US012067283B2

(12) United States Patent
Senoo et al.

(10) Patent No.: US 12,067,283 B2
(45) Date of Patent: Aug. 20, 2024

(54) MEMORY APPARATUS AND MEMORY TESTING METHOD THEREOF FOR CORRECTING ROM CODE HAVING ERROR BY ECC PROCESSING UNIT AFTER DETERMINED TO TRANSITION TO SAFE MODE

(71) Applicant: Winbond Electronics Corp., Taichung (TW)

(72) Inventors: Makoto Senoo, Kanagawa (JP); Katsutoshi Suito, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 57 days.

(21) Appl. No.: 17/851,041

(22) Filed: Jun. 28, 2022

(65) Prior Publication Data
US 2022/0413748 A1  Dec. 29, 2022

(30) Foreign Application Priority Data
Jun. 29, 2021 (JP) .................. 2021-107309

(51) Int. Cl.
G06F 3/06 (2006.01)
(52) U.S. Cl.
CPC .......... *G06F 3/0655* (2013.01); *G06F 3/0619* (2013.01); *G06F 3/0679* (2013.01)
(58) Field of Classification Search
CPC ..... G06F 3/0655; G06F 3/0619; G06F 3/0679
See application file for complete search history.

(56) References Cited

U.S. PATENT DOCUMENTS

| 7,433,247 | B2 | 10/2008 | Zheng et al. | |
|---|---|---|---|---|
| 9,063,851 | B2 | 6/2015 | Poenaru et al. | |
| 2013/0080858 | A1* | 3/2013 | Lee | G11C 11/5642 714/E11.054 |
| 2015/0178155 | A1 | 6/2015 | Kim et al. | |
| 2022/0237079 | A1* | 7/2022 | Cariello | G06F 11/0793 |
| 2022/0382464 | A1* | 12/2022 | Kim | G06F 3/0619 |

FOREIGN PATENT DOCUMENTS

| CN | 109428670 | 3/2019 |
|---|---|---|
| TW | I459391 | 11/2014 |

OTHER PUBLICATIONS

"Office Action of Taiwan Counterpart Application", issued on May 8, 2023, p. 1-p. 7.

* cited by examiner

*Primary Examiner* — Edward J Dudek, Jr.
(74) *Attorney, Agent, or Firm* — JCIPRNET

(57) ABSTRACT

A semiconductor memory device and an operation method capable of suppressing malfunctions and the like and performing safe operations are provided. A flash memory of the disclosure includes a controller which controls an operation based on a code read from a ROM. The operation method of the disclosure includes detecting whether the code read from the ROM has an error by a CRC processing unit; determining whether to transition to a safe mode when the code having the error is detected; and detecting and correcting the error of the code by an ECC processing unit after transitioning to the safe mode.

18 Claims, 7 Drawing Sheets

MEMORY APPARATUS AND MEMORY TESTING METHOD THEREOF FOR CORRECTING ROM CODE HAVING ERROR BY ECC PROCESSING UNIT AFTER DETERMINED TO TRANSITION TO SAFE MODE

CROSS-REFERENCE TO RELATED APPLICATION

This application claims the priority benefit of Japan application serial no. 2021-107309, filed on Jun. 29, 2021. The entirety of the above-mentioned patent application is hereby incorporated by reference herein and made a part of this specification.

BACKGROUND

Technical Field

The invention relates to a semiconductor memory device, and particularly relates to a semiconductor memory device and an operation method thereof that are controlled by a central processing unit (CPU) or a microcontroller based on codes read from a read-only memory (ROM).

Description of Related Art

In a memory device, for example, a NAND flash memory, when power is turned on, setting information related to an operation is loaded into a register from a fuse cell, and operating voltages of reading, programming, erasing, etc., are adjusted based on the setting information. For example, U.S. Pat. No. 7,433,247 discloses a power-on procedure of a non-volatile memory including: determining whether data read from a pre-check fuse cell is consistent with pre-check data, and storing setting information read from a main fuse cell in a non-volatile memory region, and determining whether data read from a post-check fuse cell is consistent with post-check data. If the pre-check and the post-check match, reading of the setting information is ended.

Generally, in a flash memory, a CPU controls various operation procedure by reading codes stored in a ROM. However, if a power supply voltage temporarily drops due to noises or a peak current, or if the ROM itself has defects or malfunction due to a stress, etc., caused by repeated reading, errors may occur in ROM reading. It is assumed that if a read error of the ROM occurs, i.e., if the read code has an error, it may cause an operation failure of a wafer (for example, busy stack, i.e., a busy state that does not return to a ready state) or a malfunction (incorrectly programming data into a cell located at a wrong address such as a fuse cell, or erasing data from the cell located at the wrong address such as the fuse cell).

In order to solve the read error of the ROM, the prior art proposes a technique of cyclic redundancy check (CRC). The CRC uses a remainder obtained by dividing information from a transmitting end by a predetermined generating polynomial to serve as check data (parity bit) and adds the information from the transmitting end with the check data to output as a codeword. A receiving end uses the same generating polynomial to divide the codeword to obtain a remainder. By comparing and checking the remainder obtained on the receiving end with the check data, it is able to check whether the received data has an error.

FIG. 1 is an operation flow of a power-on procedure of a flash memory using the CRC. When the power is turned on, the CPU reads a code from the ROM (S10), and checks whether the code has an error based on the CRC (S20). If no error is detected (S30), setting information is read from a fuse cell (S40), and the read setting information is loaded into a register (S50). When an error is detected, reading of the ROM code is repeated. In this case, a number of retries for reading the ROM code is held, and if the number of retries is equal to or less than a predetermined value N (S60), reading of the ROM code is repeated (S10) after waiting for improvement of an operating environment (S70). When the number of retries exceeds the predetermined value N, the power-on procedure ends in failure.

Such CRC may detect and notify occurrence of a certain accidental error, but cannot prevent various operation failures and malfunctions. In addition, in the failure analysis of the flash memory, etc., it is difficult to accurately identify the cause of the error only through the checking of the CRC.

SUMMARY

The invention solves the problems of the prior art, and an objective of the invention is to provide a semiconductor memory device and an operating method capable of suppressing malfunction and the like and performing safe operations. In an operation method of a semiconductor memory device, the semiconductor memory device includes a controller that controls an operation based on a code read from a read-only memory, the controller includes a cyclic redundancy check (CRC) processing unit, and the operation method includes: detecting whether a first code read from the read-only memory has an error by the CRC processing unit by using a first algorithm; and determining whether to transition to a safe mode by the controller when detecting that the first code has the error; and detecting and correcting the error of the first code by an ECC processing unit after the controller determines to transition to the safe mode.

The invention provides a semiconductor memory device including a controller that controls an operation based on a code read from a read-only memory, the controller includes: a cyclic redundancy check (CRC) processing unit configured to detect whether a first code read from the read-only memory has an error by using a first algorithm; a determination circuit configured to determine whether to transition to a safe mode when the CRC processing unit detects that the first code has the error; and an error checking and correcting (ECC) processing unit configured to detect and correct the error of the first code after transitioning to the safe mode.

According to the invention, when an error of the code read from the ROM is checked and the transition to the safe mode is performed, the error of the code is checked and the checked error is corrected, so that the malfunction based on the code of the ROM may be suppressed. In addition, by using different algorithms to multiple operations included in the operation procedure to check multiple errors, it is adapted to more effectively suppress malfunctions or operation failures. Furthermore, by holding and outputting the check information related to error checking and correcting information related to error checking and correcting, it is possible to easily identify or analyze the part causing the malfunction or operation failure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The semiconductor memory device of the invention includes a memory device, or a microprocessor, microcontroller, logic, application specific integrated circuit (ASIC) embedded in the memory device, a processor for processing images or sounds, and a processor for processing signals such as wireless signals, etc. In the following descriptions, the NAND flash memory is exemplified, but the invention is not limited thereto.

Figure 2:
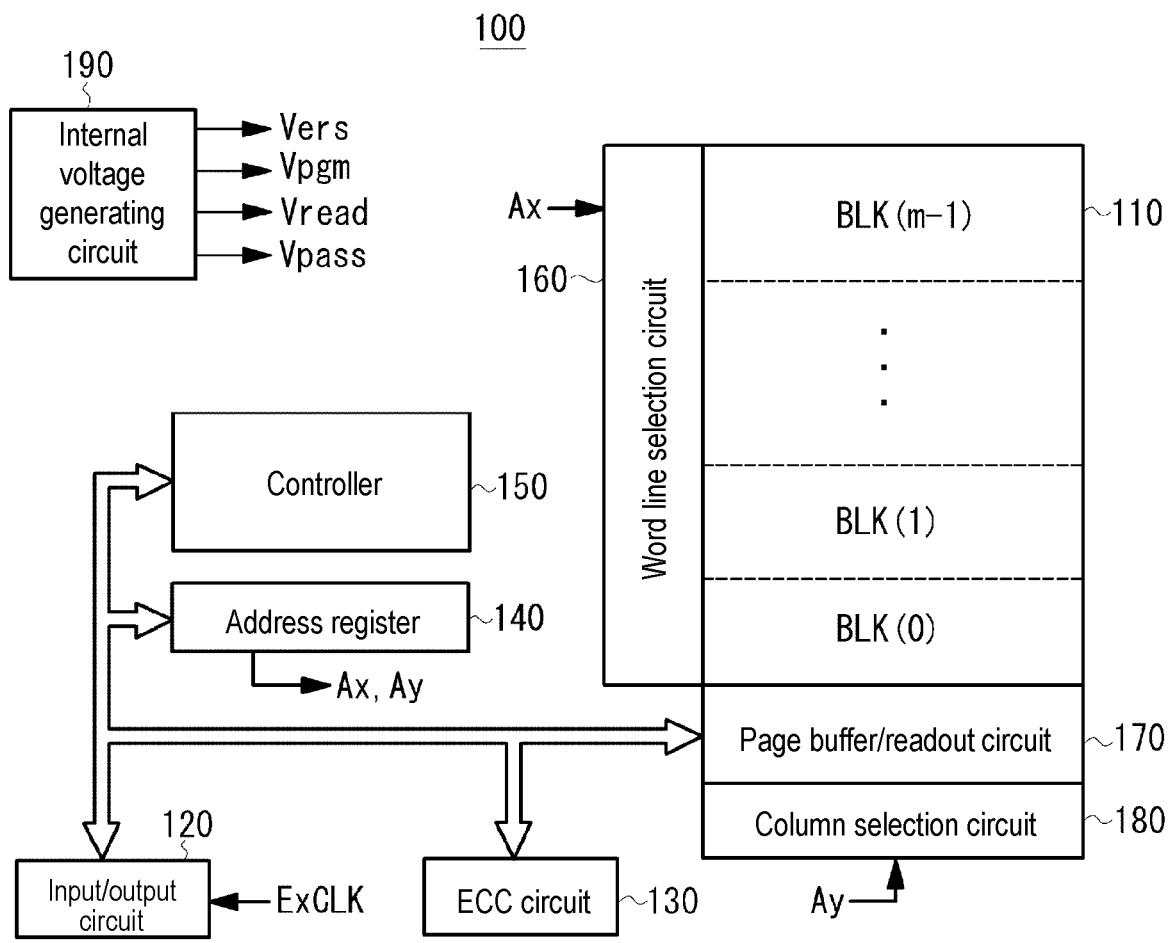
FIG. 2 is a block diagram of a NAND flash memory according to an embodiment of the invention.

FIG. 2 is a functional block diagram illustrating a NAND flash memory according to an embodiment of the invention. The flash memory 100 includes a memory cell array 110, an input/output circuit 120, an error checking and correcting (ECC) circuit 130, an address register 140, a controller 150, a word line selection circuit 160, a page buffer/readout circuit 170, a column selection circuit 180 and an internal voltage generation circuit 190. The memory cell array 110 includes a plurality of memory cells arranged in a matrix. The input/output circuit 120 outputs read data to the outside, or receives data input from the outside. The ECC circuit 130 generates parity data of data to be programmed, and detects and corrects an error of programmed data read out from the memory cell array 110 based on the parity data. The address register 140 receives address data via the input/output circuit 120. The controller 150 controls various circuits in the flash memory 100 based on command data received via the input/output circuit 120 or a control signal applied to the terminal. The word line selection circuit 160 receives and decodes row address information Ax from the address register 140, and selects a memory block or a word line based on a decoding result. The page buffer/readout circuit 170 holds data read from a page selected by the word line selection circuit 160, or holds data programmed into the selected page. The column selection circuit 180 receives and decodes column address information Ay from the address register 140, and performs column selection in the page buffer/readout circuit 170 based on a decoding result. The internal voltage generation circuit 190 generates various voltages (program voltage Vpgm, pass voltage Vpass, read pass voltage Vread, erase voltage Vers, etc.) required for reading, programming, erasing, etc., data.

The memory cell array 110 includes a plurality of memory blocks BLK (0), BLK (1), ..., BLK (m−1) arranged in a column direction, in which each memory block includes NAND strings each formed by a plurality of memory cells connected in series. In addition to a memory region provided for user's usage, the memory cell array 110 further includes a memory region composed of, for example, fuse cells that are not provided for user's usage (or cannot be accessed by the user). The fuse cell stores setting information related to the operation of the flash memory (for example, voltage setting for programming or erasing or setting of user options, etc.), the setting information is read during a power-on procedure, and the read setting information is loaded into the register.

Figure 3:
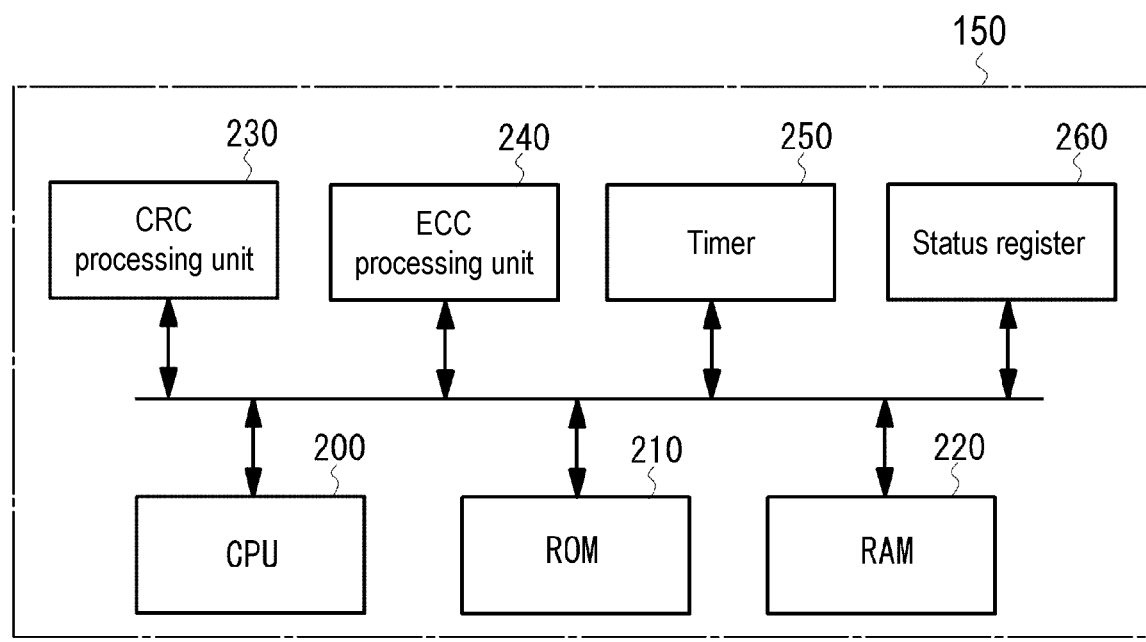
FIG. 3 is a diagram illustrating functions included in a controller according to an embodiment of the invention.

FIG. 3 illustrates a structure of the controller 150 of the embodiment. The controller 150 includes a CPU 200, a ROM 210, a random access memory (RAM) 220, a CRC processing unit 230, an ECC processing unit 240, a timer 250 and a status register 260.

The CPU 200 reads a code from the ROM 210 according to an address set in a program counter in the controller 150, decodes the read code and controls the operations of the word line selection circuit 160, the page buffer/readout circuit 170, the column selection circuit 180, and the internal voltage generation circuit 190, etc., based on a decoding result of the read code. The program counter is incremented in synchronization with a clock signal, and the CPU 200 reads next code from the ROM 210 to control next operation.

The ROM 210 stores codes for executing various operation procedures. For example, it stores codes (including instruction codes or addresses) for controlling operations such as a power-on procedure, reading, programming, erasing, etc. A number of bits or a number of bytes of the code that the CPU 200 reads from the ROM 210 at a time is not particularly limited.

The CRC processing unit 230 checks whether or not an error is included in the code (which is referred to as a ROM code hereinafter) read by the CPU 200 from the ROM 210. In order to perform cyclic redundancy check of the ROM code, CRC parity bits (check data) may be stored in the ROM 210. On the other hand, the CRC processing unit 230 divides the code read from the ROM by using the same generating polynomial as the generating polynomial used in the ROM 210, and checks whether an obtained remainder matches the CRC parity bit. The generating polynomial used by the CRC processing unit 230 and the generated remainder may be stored in the CRC processing unit 230. Moreover, in an alternative embodiment, the CRC parity bit may also be stored in hard-wired logic or non-volatile memory without additionally configuring a region in the ROM 210 for storing the CRC parity bit.

In the embodiment, if the CRC processing unit 230 checks that the ROM code contains an error, after entering a safe mode, the ECC processing unit 240 may detect the error in the ROM code and correct the detected error. In order to perform error checking and correcting of the ROM code, the ECC parity bit generated when the code is symbolized by using the ECC may be stored in the ROM 210. The ECC processing unit 240 decodes the code (the data and the ECC parity bit of the data) read from the ROM 210, detects erroneous bits of the code read from the ROM, and corrects the erroneous bits. The number of bits adapted to error checking and correcting is not particularly limited. After the operation mode of the CPU 200 is transited to the safe mode, error checking and correcting performed by the ECC processing unit 240 is executed, and the error-corrected data is held in the RAM 220. Furthermore, when the flash memory 100 is provided with the ECC circuit 130, the ECC circuit 130 may be shared as the ECC processing unit 240. Moreover, in an alternative embodiment, the ECC parity bit may also be stored in hard-wired logic or non-volatile memory without additionally configuring a region in the ROM 210 for storing the ECC parity bit.

The timer 250 measures an elapsed time of the running procedure based on the code of the ROM 210 by the CPU 200. Although the timer 250 is configured by hardware different from the CPU 200, the CPU 200 may give a count instruction to the timer 250 when reading a code from the ROM 210. In one aspect, the timer 250 outputs an interrupt signal to the CPU 200 when the measured time reaches a predetermined time Tn, and the CPU 200 shifts to the safe mode in response to the interrupt signal.

During a period when the CPU 200 reads the code from the ROM 210, the status register 260 holds information such as whether the CRC processing unit 230 detects an error, a number of times of error checking performed by the CRC processing unit 230, an error checking bit number, a ROM region where the error is detected, an elapsed time of the running procedure (which is referred to as CRC error information hereinafter), etc. In addition, the status register 260 also holds information such as the number of retries for error checking and correcting performed by the ECC processing unit 240, an error correcting bit number, an error correcting location, whether the error(s) can be corrected by the ECC processing unit 240 (which is referred to as ECC information hereinafter), etc. The data held by the status register 260 may be read by the user through commands.

Figure 4:
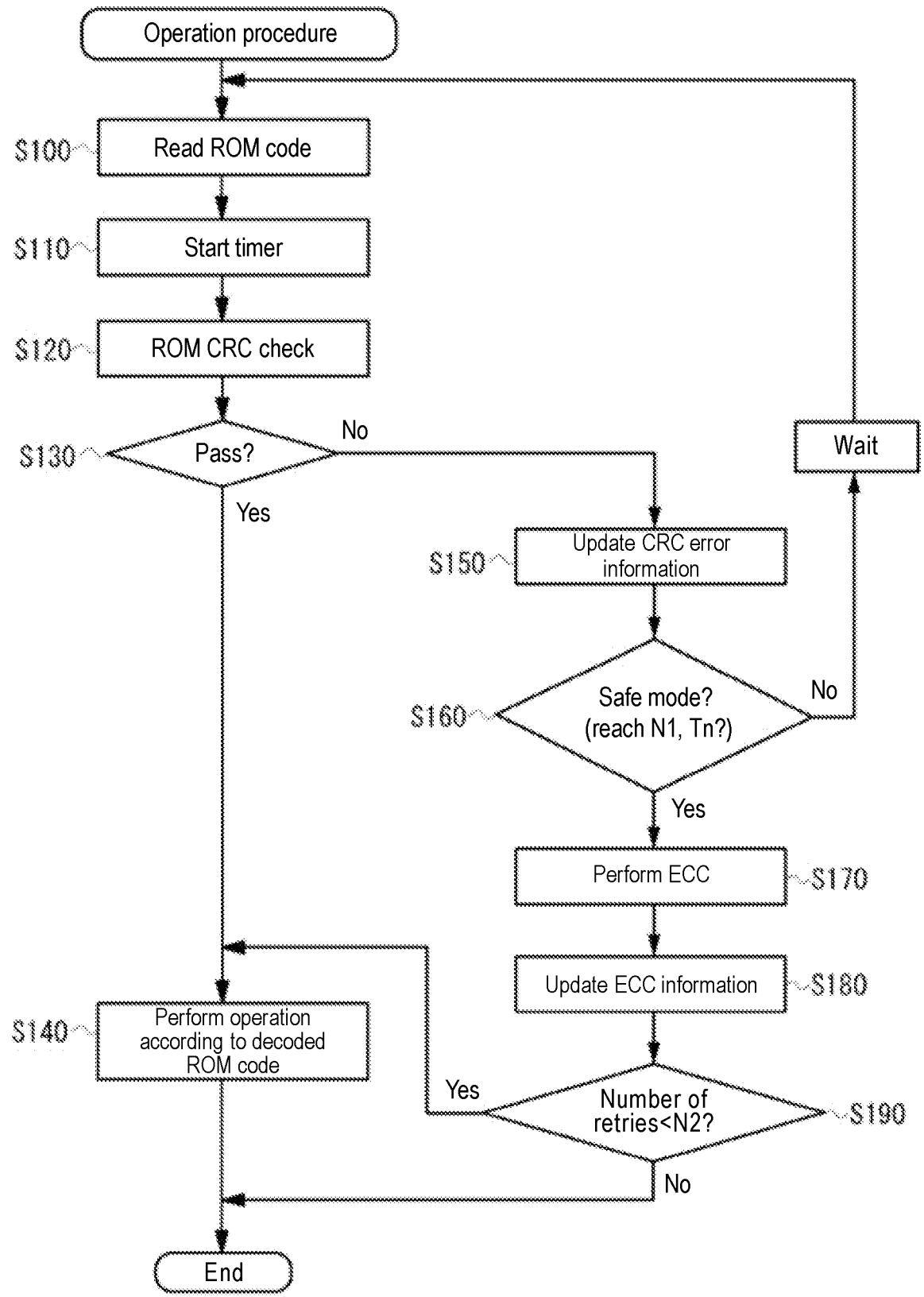
FIG. 4 is a flowchart illustrating operations of the controller according to a first embodiment of the invention.

Then, the operation of the controller 150 of the first embodiment of the present invention will be described with reference to the flowchart of FIG. 4. Furthermore, the operation procedure executed by the controller 150 is arbitrary, and is not limited to a specific operation procedure. First, the CPU 200 reads the code from the ROM 210 according to an address set in the program counter (S100). At a time point when the operation procedure starts, the CPU 200 starts the timer 250 (S110). The timer 250 measures an elapsed time of the operation procedure being executed, and outputs an interrupt signal to the CPU 200 when the measured time reaches a predetermined time Tn.

The CPU 200 supplies the code read from the ROM 210 to the CRC processing unit 230, and the CRC processing unit 230 detects whether the read code has an error (S120). When no error is detected (S130, Yes), the CPU 200 decodes the code read from the ROM 210 and executes an operation specified by the code (S140).

On the other hand, if an error is detected (S130, No), the CPU 200 updates CRC error information held in the status register 260 (S150), and then determines whether to transition to the safe mode (S160). A determination condition for transitioning to the safe mode is that when the number of times of error checking based on the CRC reaches a predetermined value N1, or when an interrupt signal from the timer 250 is received (i.e., when a reading time of the ROM 210 reaches a predetermined time Tn), the CPU 200 determines to transition to the safe mode. In an embodiment, the step S150 includes counting and updating the number of times of error checking of the CRC processing unit 230 by a counter.

When the CPU 200 shifts to the safe mode, the CPU 200 enables the ECC processing unit 240 to perform error checking and correcting (S170). At this time, the ECC processing unit 240 may store all the codes read from the ROM 210 in the RAM 220, or may only store location information for error correcting in the RAM 220. The CPU 200 also updates the ECC information held in the status register 260 (S180).

The CPU 200 determines whether the number of retries for error checking and correcting performed by using the ECC processing unit 240 reaches a predetermined value N2 (S190), and determines that the ROM code after error correcting is reliable if the predetermined value N2 is not reached, and performs decoding on the corrected code held in the RAM 220 or on the error corrected location information obtained by holding the code read from the ROM 210 in the RAM 220, and performs an operation according to a decoding result (S140). On the other hand, when the number of times of error checking and correcting reaches the predetermined value N2, it is determined that a safe operation cannot be expected and the operation procedure is ended. In one embodiment, in step S190, a second counter is used to count the number of retries of the ECC processing unit 240 detecting and correcting the error in the ROM code.

In this way, according to the embodiment, if the code read from the ROM has an error, further error checking and correcting is performed by the ECC processing unit 240 under certain conditions, so that a safe operation may be performed to avoid malfunction or operation failure. Moreover, since the CRC error information and the ECC information may be held in the status register 260 and the held corresponding information may be output, the user may easily perform a detailed analysis on the malfunction of the memory device.

Figure 5:
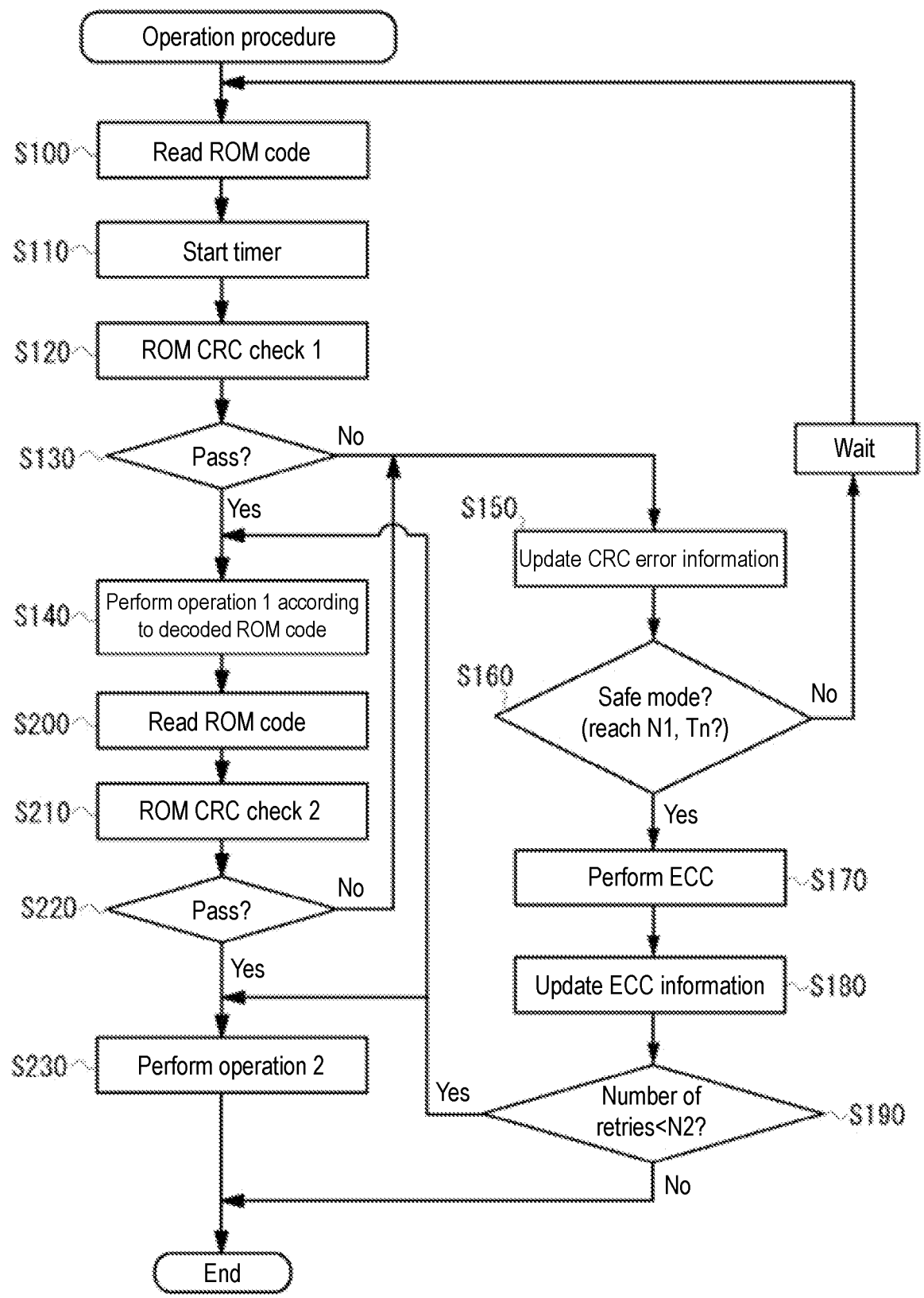
FIG. 5 is a flowchart illustrating operations of the controller according to a second embodiment of the invention.

FIG. 5 is a diagram showing an operation flow of a second embodiment. In the second embodiment, different algorithms are used to perform CRC check at multiple moments of the operation procedure.

In FIG. 5, steps S100 to S190 are the same as those in the first embodiment, but in the second embodiment, after performing operation 1 (S140), in order to perform operation 2 subsequent to operation 1, the CPU 200 reads the code from the ROM 210 (step S200). Then, the code read from the ROM 210 is checked by the CRC processing unit 230 (step S210). In the embodiment, algorithms of CRC check 1 (step S120) of the ROM code for operation 1 and CRC check 2 (step S210) of the ROM code for operation 2 are different. For example, the generating polynomial used in CRC check 1 is different from that used in CRC check 2. In this case, the ROM 210 stores the code corresponding to operation 2 and the CRC parity bit as a remainder obtained by dividing the code corresponding to operation 2 by the generating polynomial of the CRC check 2, the generating polynomial of the CRC check 2 is stored in the CRC processing unit 230 and a remainder for comparison with the CRC parity bit of the CRC check 2 is generated by the CRC processing unit 230.

The CPU 200 determines whether there is an error in the ROM code by using the CRC processing unit 230 (S220). If no error is detected by the CRC processing unit 230 (S220, Yes), the CPU 200 decodes the ROM code, and performs operation 2 according to the decoding result (S230). On the other hand, when an error is detected in the ROM code (S220, No), steps S150 to S190 similar to those in the first embodiment are executed. It is assumed that the transition to the safe mode is made and the number of retries for error checking and correcting is less than the predetermined value N2, the CPU 200 decodes the corrected code and executes operation 2 (S230). If the number of retries for error checking and correcting is equal to the predetermined value N2, the operation procedure ends. In addition, in the status register 260, the CRC error information and the ECC information related to operation 1 and operation 2 are kept.

As described above, according to the embodiment, by using a plurality of CRC check operation procedures with different checking capabilities, it is possible to perform processing corresponding to various main factors that cause malfunctions or operation failures, and may easily perform analysis of such main factors. Moreover, the above embodiment shows an example in which the operation procedure includes operation 1 and operation 2, but this is only an example, and the operation procedure may include operation 1, operation 2, . . . , and operation n. In this case, the CRC processing unit 230 performs CRC check 1, CRC check 2, . . . , and CRC check n with different checking abilities or algorithms, and determine whether to transition to the safe mode according to the check result.

Figure 6:
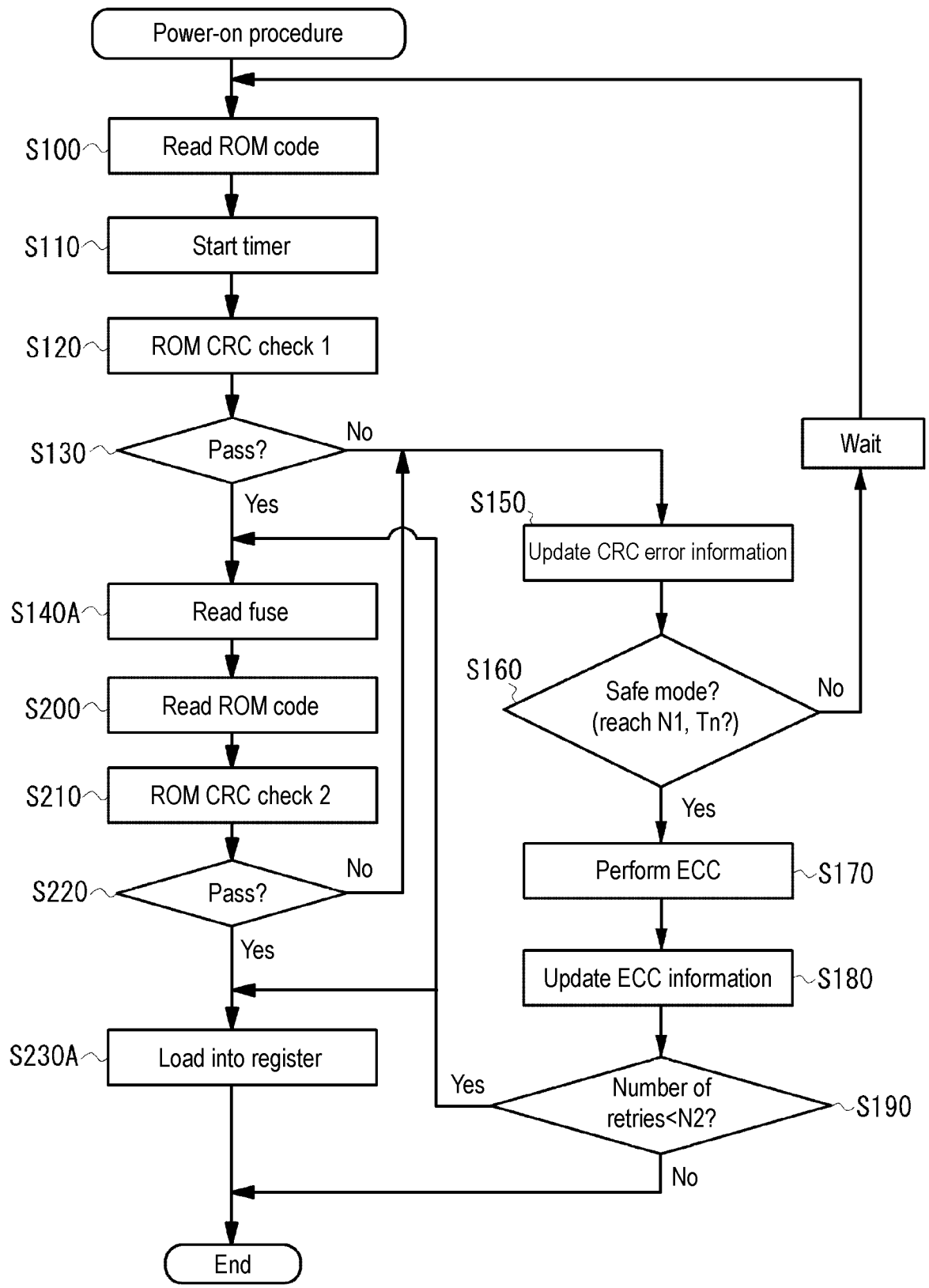
FIG. 6 is a flowchart illustrating operations of a power-on procedure according to the second embodiment of the invention.

A specific example of the operation procedure of the second embodiment will be described below. FIG. 6 is a flowchart of a reading operation of a ROM code when a power-on procedure is executed. The basic operation is the same as that shown in FIG. 5. In the power-on procedure, the setting information is read from the fuse cell (S140A), which corresponds to operation 1, and the read setting information is loaded into the register (S230A), which corresponds to operation 2.

Figure 7:
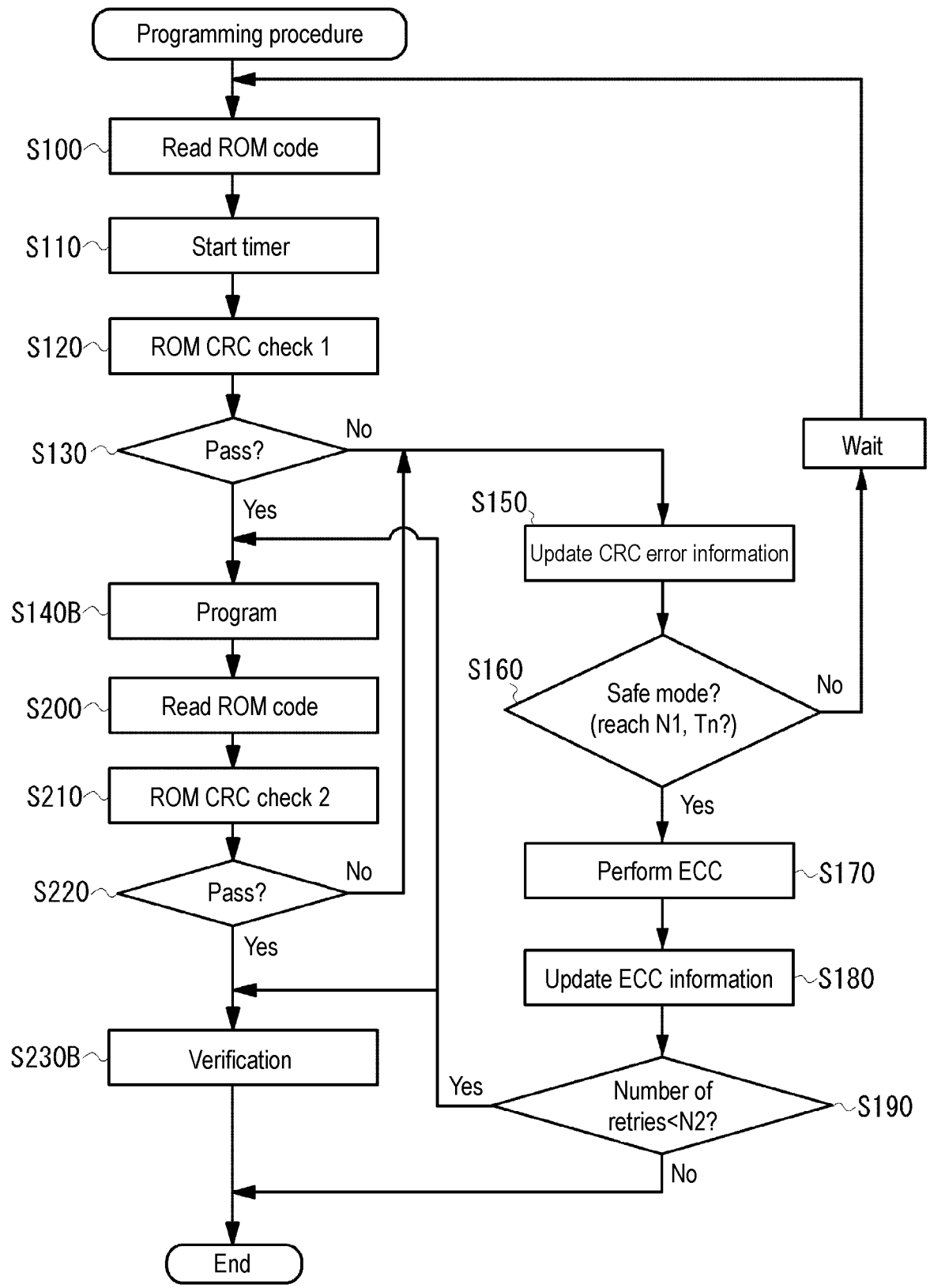
FIG. 7 is a flowchart illustrating operations of a programming procedure according to the second embodiment of the invention.
Figure 8:
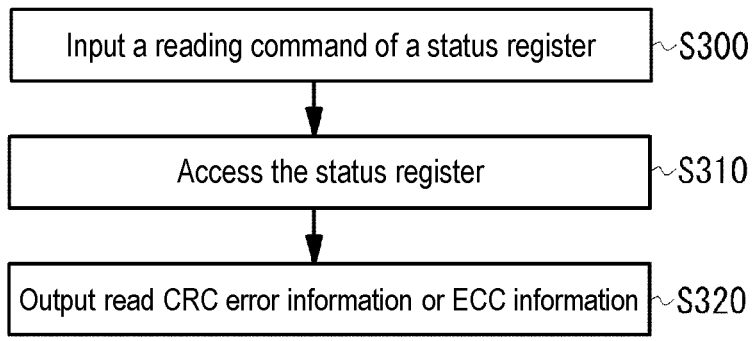
FIG. 8 is a flowchart illustrating an output example of a status register according to an embodiment of the invention.

FIG. 7 is a flowchart of a reading operation of a ROM code when a programming procedure is executed. The basic operation is the same as that shown in FIG. 5. In the programming procedure, a programming voltage is applied to a selected page (S140B), which corresponds to operation 1, and the programmed page is read to perform programming verification (S230B), which corresponds to operation 2. The operation procedure of the second embodiment may also be applied to other reading operation procedures or erasing operation procedures other than the power-on procedure or the programming procedure.

Then, the status register 260 of the embodiment will be described. As shown in Table 1, the status register 260 holds the CRC error information based on the CRC processing unit 230, which includes, for example, whether the CRC result is passed or failed, the number of CRC retries, a measured time of the timer 250 (used for subsequent judgment of whether the predetermined time Tn is reached) etc. Moreover, the status register 260 also holds the ECC information based on the ECC processing unit 240, which includes, for example, whether the ECC correction may be performed, the number of ECC retries, an error correcting bit number or a location thereof, etc. The CPU 200 updates the CRC error information or the ECC information in the status register 260 during the reading operation of the ROM code.

TABLE 1

| | CRC error information | ECC information |
|---|---|---|
| Status register | CRC passed or failed<br>Number of CRC retries<br>Measured time of timer | Whether ECC correction may be performed<br>Number of ECC retries<br>Error correcting bit number or location thereof |

Figure 9:
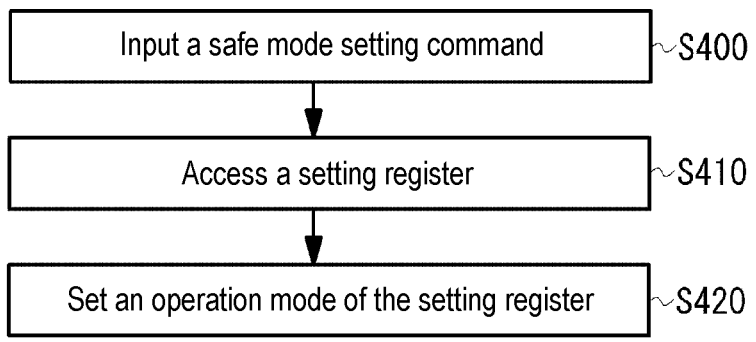
FIG. 9 is a flowchart illustrating setting of an operation mode according to a third embodiment of the invention.

FIG. 9 is a flowchart illustrating a method of reading data from the status register 260. After the user inputs a reading command of the status register 260 to the flash memory 100 (S300), the controller 150 accesses the status register 260 according to an interpretation result of the reading command (S310), and outputs the CRC error information or the ECC information held in the status register 260 through the input/output circuit 120 (S320). By referring to the CRC error information or the ECC information, the user may analyze the operating conditions that the ROM code has errors, or whether the ROM 210 is defective or not.

Then, a third embodiment of the invention is described. In the first embodiment and the second embodiment, the operation under the safe mode may be performed. On the other hand, a time required for the operation may exceed a time of the design specification. Therefore, in the third embodiment, the user may set whether the flash memory 100 may be operated in the safe mode.

Figure 1:
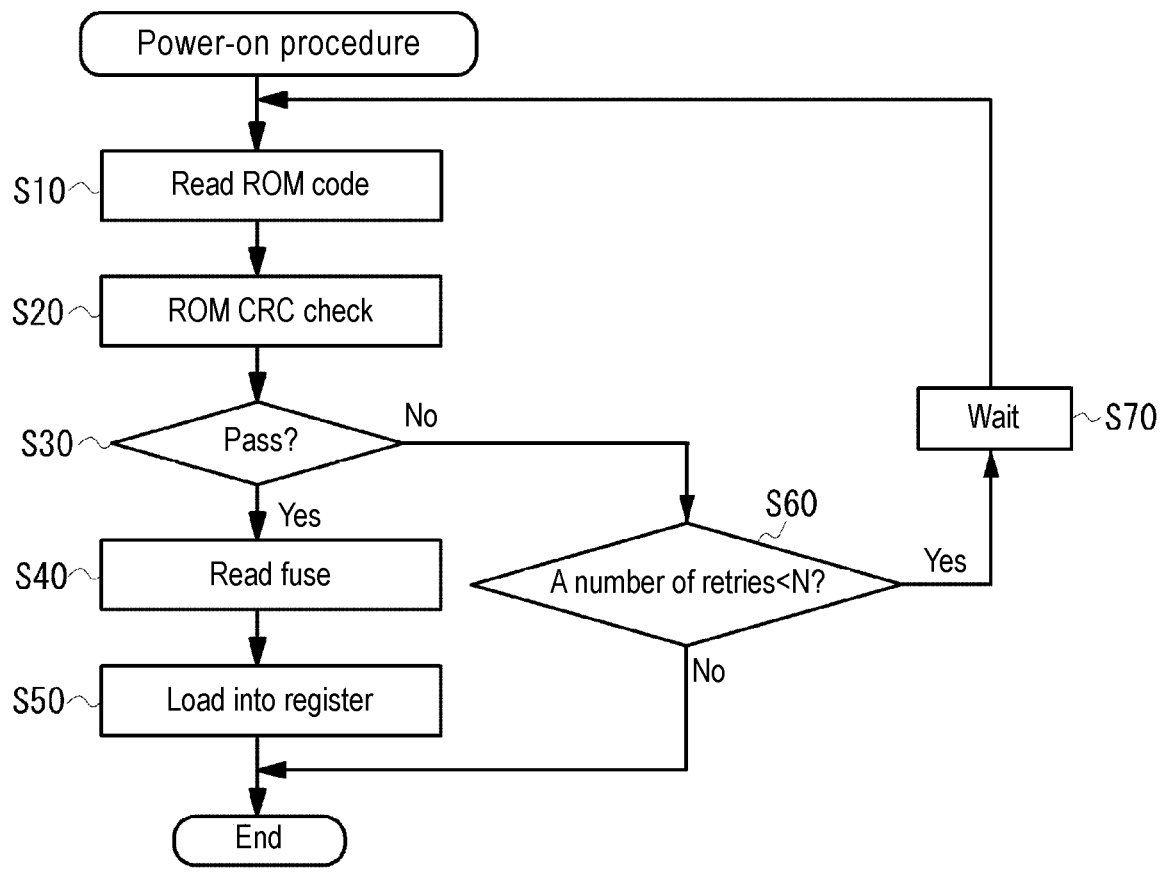
FIG. 1 is an operation flow of a power-on procedure of a conventional flash memory.

The controller 150 uses a setting register shown in Table 2 to set whether the operation of the safe mode may be performed. For example, a flag "1" is to set enabling of the safe mode, and a flag "0" is to set disabling of the safe mode. It is assumed that when the flag "0" is set, the CPU 200 does not transition to the safe mode in FIG. 4, FIG. 5, etc., but only checks the CRC as shown in FIG. 1.

TABLE 2

| Flag of setting register | 1 | 0 |
|---|---|---|
| Operation mode | Safe mode enabling | Safe mode disabling |

FIG. 9 is a flowchart illustrating a setting method of a setting register. After the user inputs a safe mode setting command into the flash memory 100 (S400), the controller 150 accesses the setting register according to an interpretation result of the safe mode setting command (S410), and set the flag of the setting register to "1" (S420). In this case, a default state of the setting register is the flag "0". When the safe mode is disabled, for example, the user inputs a safe mode disable command to the flash memory 100.

In this way, according to the embodiment, the user may set whether the operation of the safe mode may be performed, for example, the safe mode may be enabled only when the analysis of the flash memory 100 is performed.

In the aforementioned embodiments, a NAND flash memory is exemplified, but the invention may be applied to a semiconductor memory device or a semiconductor memory device in which a CPU controls operation procedure based on codes read from a ROM.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. An operation method of a semiconductor memory device, the semiconductor memory device comprising a controller that controls an operation based on a code read from a read-only memory, the controller comprising a cyclic redundancy check (CRC) processing unit, and the operation method comprising:

detecting whether a first code read from the read-only memory has an error by the CRC processing unit by using a first algorithm;

determining whether to transition to a safe mode by the controller when the CRC processing unit detects that the first code read from the read-only memory has the error; and detecting and correcting the error of the first code detected by the CRC processing unit by an ECC processing unit after the controller determines to transition to the safe mode.

2. The operation method as claimed in claim 1, further comprising:
counting a number of times of error checking of the CRC processing unit detecting whether the first code has the error by using the first algorithm,
wherein the step of determining whether to transition to the safe mode by the controller comprises:
determining whether the number of times of error checking reaches a first predetermined value; and
determining to transition to the safe mode by the controller when the number of times of error checking reaches the first predetermined value.

3. The operation method as claimed in claim 1, further comprising:
measuring an elapsed time of an operation procedure in execution,
wherein the step of determining whether to transition to the safe mode by the controller comprises:
determining whether the measured elapsed time exceeds a predetermined time; and
determining to transition to the safe mode when the measured elapsed time exceeds the predetermined time.

4. The operation method as claimed in claim 1, further comprising:
performing a first operation based on the read first code or the corrected first code.

5. The operation method as claimed in claim 4, further comprising:
reading a second code corresponding to a second operation from the read-only memory after the first operation;
detecting whether the read second code has an error by the CRC processing unit by using a second algorithm different from the first algorithm;
determining whether to transition to a safe mode by the controller when detecting that the second code has the error; and
detecting and correcting the error of the second code by the ECC processing unit when the controller determines to transition to the safe mode.

6. The operation method as claimed in claim 1, further comprising:
counting a number of retries of the ECC processing unit detecting and correcting the error of the first code; and
ending the operation by the controller when the number of retries exceeds a second predetermined value.

7. The operation method as claimed in claim 1, further comprising:
holding and updating CRC error information related to error checking performed by the CRC processing unit in a status register; and
holding and updating ECC information related to error checking and correcting performed by the ECC processing unit in the status register.

8. The operation method as claimed in claim 7, further comprising:
outputting the CRC error information and the ECC information via an input/output circuit.

9. The operation method as claimed in claim 8, wherein the CRC error information comprises at least one of whether an error is detected, a number of times of error checking, and an elapsed time of an operation procedure in execution, and the ECC information comprises at least one of whether correction is able to be performed, a number of retries for error checking and correcting, and an error correcting bit number.

10. The operation method as claimed in claim 1, further comprising:
setting the safe mode to enable or disable,
wherein the controller determines whether to transition to the safe mode only when the safe mode is set to enable.

11. The operation method as claimed in claim 5, wherein the first operation is to read setting information from a fuse cell, and the second operation is to load the setting information read from the fuse cell into a register.

12. A semiconductor memory device, comprising a controller that controls an operation based on a code read from a read-only memory, and
the controller comprising:
a cyclic redundancy check (CRC) processing unit, configured to detect whether a first code read from the read-only memory has an error by using a first algorithm;
a determination circuit, configured to determine whether to transition to a safe mode when the CRC processing unit detects that the first code has the error; and
an error checking and correcting (ECC) processing unit, configured to detect and correct the error of the first code detected by the CRC processing unit after transitioning to the safe mode.

13. The semiconductor memory device as claimed in claim 12, further comprising:
a first counter, configured to count and update a number of times of error checking of the CRC processing unit checking whether the first code has the error by using the first algorithm,
wherein the determination circuit is configured to determine whether the number of times of error checking reaches a first predetermined value, and when the number of times of error checking reaches the first predetermined value, the determination circuit determines to transition to the safe mode.

14. The semiconductor memory device as claimed in claim 12, wherein the controller further comprises:
a timer, configured to measure an elapsed time of an operation procedure in execution,
wherein the determination circuit determines whether the measured elapsed time exceeds a predetermined time, and determines to transition to the safe mode when the measured elapsed time exceeds the predetermined time.

15. The semiconductor memory device as claimed in claim 12, wherein the controller is configured to perform a first operation based on the read first code or the corrected first code, and read a second code corresponding to a second operation from the read-only memory after the first operation,
the CRC processing unit is configured to detect whether the read second code has an error by using a second algorithm different from the first algorithm,
the determination circuit is configured to determine whether to transition to the safe mode when the CRC processing unit detects that the second code has the error, and
the ECC processing unit is configured to detect and correct the error of the second code after transitioning to the safe mode.

16. The semiconductor memory device as claimed in claim 12, further comprising:
a second counter, configured to count a number of retries of the ECC processing unit detecting and correcting the error of the first code, wherein the controller is configured to end reading the code from the read-only memory when the number of retries exceeds a second predetermined value.

17. The semiconductor memory device as claimed in claim 12, wherein the controller further comprises a status register configured to hold and update CRC error information related to error checking performed by the CRC processing unit, and ECC information related to error checking and correcting performed by the ECC processing unit.

18. The semiconductor memory device as claimed in claim 12, wherein the controller further comprises a setting register configured to set the safe mode to enable or disable, and the determination circuit determines whether to transition to the safe mode only when the safe mode is set to enable.

* * * * *